(12) United States Patent
Lamson et al.

(10) Patent No.: US 6,424,027 B1
(45) Date of Patent: Jul. 23, 2002

(54) LOW PASS FILTER INTEGRAL WITH SEMICONDUCTOR PACKAGE

(75) Inventors: Michael A. Lamson, Anna; Heping Yue, Dallas; Truong Ho, Arlington, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/659,927

(22) Filed: Sep. 12, 2000

Related U.S. Application Data

(60) Provisional application No. 60/154,313, filed on Sep. 16, 1999.

(51) Int. Cl.[7] ............................................. H01L 23/495
(52) U.S. Cl. ........................................ 257/676; 257/728
(58) Field of Search ................................. 257/697, 535, 257/532, 724, 676, 728

(56) References Cited

U.S. PATENT DOCUMENTS 5,428,245 A * 6/1995 Lin et al. ..................... 257/924
6,091,144 A * 7/2000 Harada ........................ 257/724

* cited by examiner

*Primary Examiner*—Roy Potter
(74) *Attorney, Agent, or Firm*—Gary C. Honeycutt; Fred Telecky; Arthur I. Navarro

(57) ABSTRACT

A semiconductor package substrate for assembling an integrated circuit chip operable at fast ramp rate signals and clock rates, comprising an insulating support having a region for attaching said chip; a pattern of electrical interconnections, disposed on said substrate in one metallization level and operable for transmitting waveforms; and a low pass filter for removing unwanted high frequency components from said transmitted waveforms, comprising a network of inductors and capacitors formed within said one metallization level and positioned substantially within said substrate region for chip attachment.

8 Claims, 5 Drawing Sheets

LOW PASS FILTER INTEGRAL WITH SEMICONDUCTOR PACKAGE

This application claims benefit provisional application Ser. No. 60/154,313 filed Sep. 16, 1999.

FIELD OF THE INVENTION

The present invention is related in general to the field of semiconductor devices and processes and more specifically to structure, materials and fabrication of high performance plastic ball grid array packages designed for very high frequency operation.

DESCRIPTION OF THE RELATED ART

Ball Grid Array (BGA) packages have emerged as an excellent packaging solution for integrated circuit (IC) chips with high input/output (I/O) count. BGA packages use sturdy solder balls for surface mount connection to the "outside world" (typically plastic circuit boards, PCB) rather sensitive package leads, as in Quad Flat Packs (QFP), Small Outline Packages (SOP), or Tape Carrier Packages (TCP). Some BGA advantages include ease of assembly, use of surface mount process, low failure rate in PCB attach, economic use of board area, and robustness under environmental stress. The latter used to be true only for ceramic BGA packages, but has been validated in the last few years even for plastic BGAs. From the standpoint of high quality and reliability in PCB attach, BGA packages lend themselves much more readily to a six-sigma failure rate fabrication strategy than conventional devices with leads to be soldered.

A BGA package generally includes an IC chip, a multilayer substrate, and a heat spreader. The chip is generally mounted on the heat spreader using a thermally conductive adhesive, such as an epoxy. The heat spreader provides a low resistance thermal path to dissipate thermal energy, and is thus essential for improved thermal performance during device operation, necessary for consistently good electrical performance. Further, the heat spreader provides structural and mechanical support by acting as a stiffener, adding rigidity to the BGA package, and may thus be referred to as a heat spreader/stiffener.

One of the substrate layers includes a signal "plane" that provides various signal lines, which can be coupled, on one end, to a corresponding chip bond pad using a wire bond (or to a contact pad using flip-chip solder connection). On the other end, the signal lines are coupled with solder "balls" to other circuitry, generally through a PCB. These solder balls form the array referred to in a BGA. Additionally, a ground plane will generally be included on one of the substrate layers to serve as an active ground plane to improve overall device performance by lowering the inductance, providing controlled impedance, and reducing cross talk. These features become the more important the higher the BGA pin count is.

In contrast to the advantages of the BGA packages, prevailing solutions in BGA packages have lagged in performance characteristics such as the ability to maintain signal integrity in high speed operation necessary for devices such as high speed digital signal processors (DSP) and mixed signal products (MSP). One major source of signal distortion derives from irregular, unwanted high-frequency radiation originating in the package substrates; another major source is a specific consequence of a BGA manufacturing method aiming at low-cost package fabrication.

Normally, packages are designed to minimize inductance and capacitance on the signal and clock traces to allow the transmission of waveforms with minimum distortions. An example for BGA packages can be found in U.S. Patent Application Serial No. 60/147,596 filed Aug. 6, 1999 (Lamson et al., "Structure and Method of High Performance Two Layer Ball Grid Array Substrate"). In some cases, where the signal or clock rise times are fast enough, some radio frequency (rf) radiation will occur in the IC within the package and/or the related circuit board.

Within the confined space of a semiconductor package, there is not enough room to accommodate additional external components, or to assemble a multi-level structure as a low pass filter. The latter idea was proposed in U.S. Pat. No. 5,668,511, issued on Sep. 16, 1997 (Furutani et al., "Low Pass Filter").

The layout of high performance ICs is typically so crowded that silicon real estate cannot be freed up to design the components of a low pass filter. This makes the implementation difficult for integrated solutions as described in U.S. Pat. No. 4,176,318, issued on Dec. 29, 1987 (Koike, "Low Pass Filter Formed in an Integrated Circuit").

BGA substrate fabrication is under economical pressure to keep manufacturing costs to a minimum. Consequently, batch fabrication techniques are preferred, which deposit interconnection lines to the desired thickness on insulating substrates directly "where wanted". For metal deposition, a very cost-effective method for batch deposition is plating, provided that it is uniform and controlled. In the BGA substrate fabrication, all lines are electrically coupled together for the period of plating deposition, and separated after completion. When this separation step is executed as a mechanical cut, it is unavoidable that small pieces of metal lines are leftover "dangling" as loose ends. In device operation, these loose ends are available to act as unwanted radiating antennas.

Consequently, a serious device signal distortion problem has arisen in high frequency devices with a need to reduce radiation in the IC. An urgent need has therefore appeared to conceive a concept for avoiding the signal distortion without interfering with the low-cost substrate manufacturing practices. Preferably, this concept should be based on a fundamental design solution flexible enough to be applied for different semiconductor product families and a wide spectrum of design and assembly variations. It should not only meet high electrical and thermal performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

According to the present invention for integrated circuit chip packages, a low pass filter, comprising a network of inductors and capacitors, for removing unwanted high frequency components from fast ramp rate signals and clock lines is provided so that it is integral to the package substrate, located substantially in the substrate region intended for chip attachment, and can be created by a single level of metallization.

A chip output signal with fast rise time (plotted in the form of voltage as a function of time; voltage and time on linear scale) can be subjected to Fourier analysis. The resultant frequency distribution can be analyzed with regard to its energy content (plotted in the form of power as function of frequency; power on exponential scale, frequency linear scale). This output signal power distribution shows a rapid fall-off towards higher frequency.

When chip signals exhibit faster and faster rise times, at constant overall signal power, the output power distribution displays an increase of the power content for higher frequencies. In order to reduce this high frequency power component back to original levels, a low pass filter is added to the IC package design. The invention describes a layout integral to the package substrate without the need for additional individual components or extra metallizations. The design provides passive filtering for fast ramp rate signals and clock lines to remove high frequency components from the transmitted waveform and thus to reduce the power share of the higher frequencies.

It is an aspect of the present invention to use a series connection of narrow and wide traces in the layout of the package substrate to create controlled inductances and capacitances to filter out high frequency components of transmitted signal or clock.

Another aspect of the invention is to provide design concepts suitable for semiconductor package substrates, especially ball grid array substrates, as well as generally for circuit boards. In all cases, the low pass filter is laid out so that it substantially fits into the region allotted to the chip attachment so that not extra substrate area needs to be consumed.

Another aspect of the invention is to provide design concepts for ball grid array substrates applicable to both wire bonded and flip-soldered chip assemblies.

Another aspect of the invention is to use only the standard metallization process flow without the need of additional process steps, multi-level structures, or electronic components, such as external capacitors and inductors, to fabricate the device package. The area requirements of the package substrate, and the thickness constraints of the package do not have to be expanded in order to accommodate the filter network according to the invention.

Another aspect of the invention is to utilize existing semiconductor fabrication processes and to reach the electrical device goals without the cost of equipment changes and new capital investment, by using the installed fabrication equipment.

Another aspect of the invention is to provide design and fabrication solutions such that they are flexible enough to be applied for different semiconductor high-performance device families and a wide spectrum of high speed, high power design and assembly variations.

These aspects have been achieved by the electrical design of the capacitance, inductance, and resistance network for bonding wire assembled IC chips in 144-ball grid array devices. As an example, at 500 MHz the output power has been attenuated from −20 dB to −25 dB. A reduction by 3 or 4 dB is sufficient.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
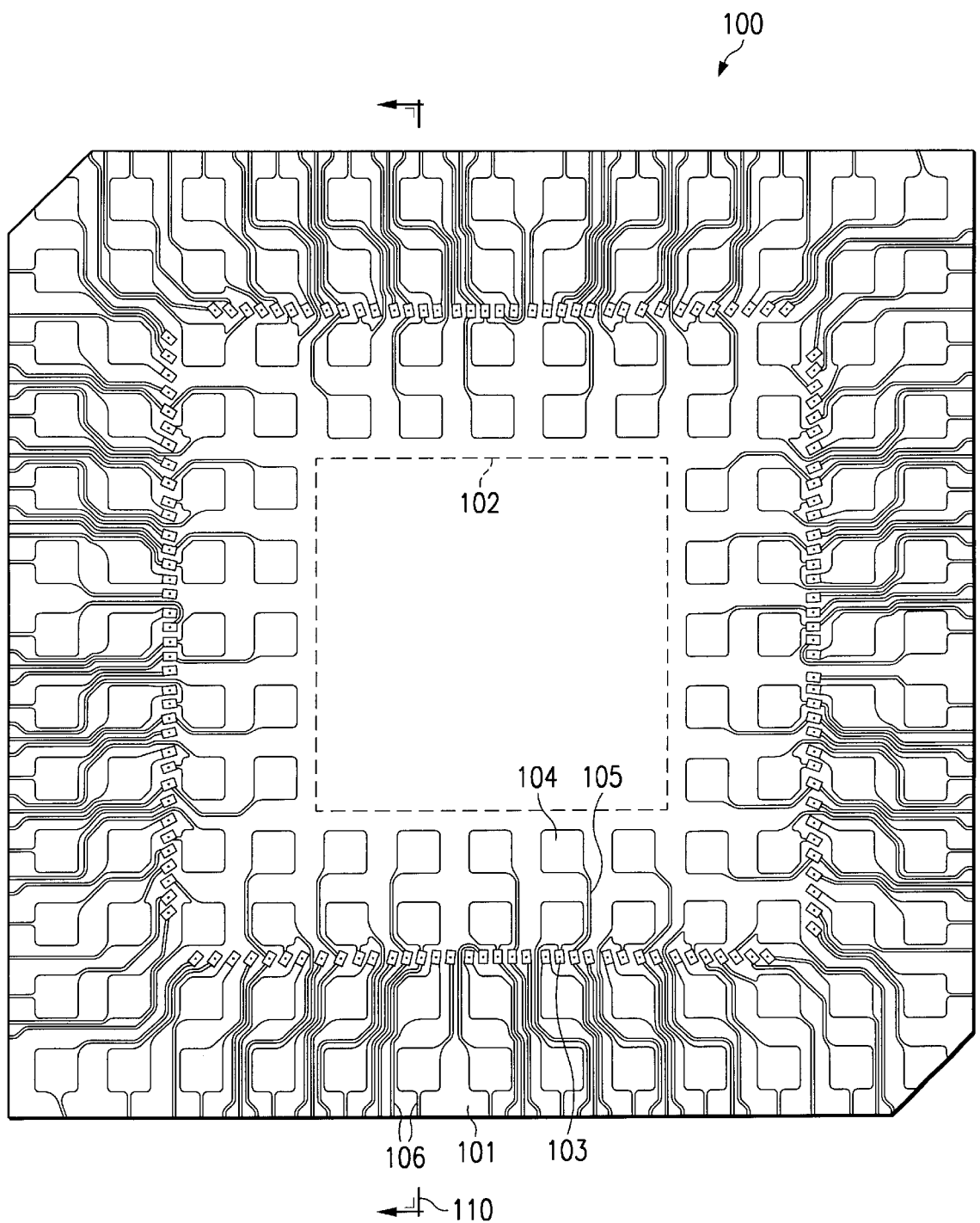
FIG. 1 shows the metal connection layout on the surface of a ball grid array substrate before the integrated circuit chip is attached.

FIG. 1 is the top view of the substrate generally designated 100 of a ball grid array (BGA) package for a semiconductor device requiring 144 connections to the "outside world". The BGA device belongs the large family of high performance high input/output (I/O) integrated circuit (IC) devices. The insulating layer 101 of the substrate is typically made of organic material selected from a group consisting of polyimide, polymer strengthened by glass fibers, FR-4 (an epoxy resin), FR-5, and BT resin. Alternative materials are cyanate ester resins reinforced with a woven glass cloth. The insulating layer preferably has a thickness in the range from about 70 to 150 $\mu$m and a dielectric constant between 4 and 5. Suitable materials are commercially available from Sheldahl Micro Products. Longmont, Colo., 80503 USA; Motorola Inc., USA; Shinko Corp., Japan; or Ibiden Corp., Japan.

The dotted line 102 in FIG. 1 encloses the area reserved for attaching the IC chip. The small rectangular areas 103 are the metallization pads for attaching the stitch bonds when the chip terminals are electrically connected to the substrate 101 by bonding wires. Commonly, these stitch pads comprise copper layers, or copper with gold flash surface, or refractory metal layers followed by copper layers with gold flash. Alternatively, they may comprise copper layers followed by nickel layers of a silver flash. The metal pads 103 preferably have a thickness in the range of about 7 to 15 $\mu$m.

The contact areas 104 serve as terminals for the metal-filled vias through the insulating layer. On the opposite side of the vias (shown in FIG. 2), counter-terminals serve as attachment sites for the solder balls of the BGA package. Connecting lines 105 connect contact areas 104 to bond stitch sites 103. Typically, these metal areas and connections are made of copper with gold flash; thickness commonly ranges from about 7 to 15 $\mu$m. A convenient and low-cost manufacturing process flow consists of depositing a thin "seed" metallization, defining interconnections and pads by photolithography, and depositing the desired metal thickness in the subsequent plating step.

The popular preference for a plating process has an important consequence for a problem solved by the present invention. Successful plating control requires uniform electrical potential applied to all areas intended to receive equal amounts of plating material. The best way to insure uniform deposition is to couple all areas-to-be-plated electrically together. After completing the plating process, the connecting lines can be severed. Unfortunately, numerous line segments will be left over as useless "dangling dead ends". Connecting lines 106 in FIG. 1 are examples of such leftovers from this plating interconnection need. In IC operation, these leftover lines 106 can act as antennas radiating unwanted high frequency radiation.

Figure 2:
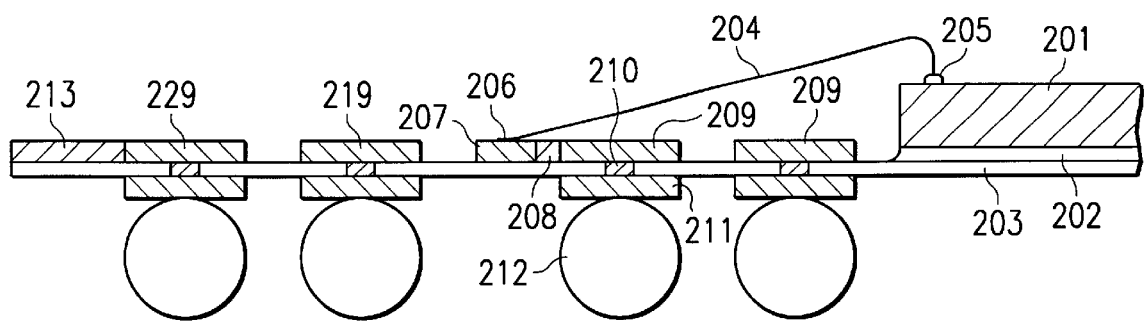
FIG. 2 is a simplified and schematic cross section of a portion of a ball grid array package substrate after attaching and wire bonding the integrated circuit chip.

FIG. 2 is a cross section along line 110 through a portion of the substrate in FIG. 1 after the IC chip has been assembled. However, the cross section is simplified and schematic. The IC chip 201 is attached by adhesive polymer 202 to insulating support layer 203. The semiconductor chip 201 is usually made of silicon, but could be silicon germanium, gallium arsenide, or any other semiconductor material used in electronic device production. In the case of silicon ICs, the thickness of the chip is typically 225 to 475 $\mu$m, and the chips may belong to product families such as digital signal processors, mixed signal devices, analog and logic circuits, application-specific ICs, and many other IC components. Attach material 202 is commonly an epoxy, sometimes silver-filled, in the thickness range from about 20 to 30 $\mu$m; it may also be a polyimide material.

Bonding wires 204 connect the chip terminals to the substrate. In standard bonding operation, ball bonds 205 are formed on the circuit bonding pads, and stitch bonds 206 are formed on the substrate metallization. Typically, standard round wire of diameter between about 18 to 33 $\mu$m is used; the ball has a typical diameter from about 1.2 to 1.6 wire diameters. The metallurgical stitch bond is formed by an imprint of the capillary used in wire bonding (about 1.5 to 3 times the wire diameter), and contact pad 207 can have small area (corresponds to 103 in FIG. 1, metal composition and thickness as mentioned above).

Contact pads 207 are connected by metal lines 208 to contact lands 209. These metallizations are usually created in a single photolithographic process step from a single metal deposition layer. Contact lands 109, in turn, serve as terminals for the metal-filled vias 210 through the insulating layer 203. On the opposite side of vias 210 are the counter-terminals 211. These counter-terminals are made of solderable metal, usually copper and/or nickel with flash of gold or palladium; sometimes a flash of platinum is used, when metal interdiffusion in the solder process is to be minimized.

Attached to counter-terminals 211 are solder balls 212. As defined herein, the term solder "balls" does not imply that the solder contacts are necessarily spherical. They may have various forms, such as semispherical, half-dome, truncated cone, or generally bump. The exact shape is a function of the deposition technique (such as evaporation, plating, or pre-fabricated units) and reflow technique (such as infrared or radiant heat), and the material composition. The solder balls comprise attach materials selected from a group consisting of tin/lead, tin/indium, tin/silver, tin/bismuth, solder paste, and conductive adhesive compounds.

As a comparison of FIG. 2 with FIG. 1 shows, some connecting metal lines 208 from stitch pads to contact lands are short (for instance, to contact land 209), others have to be designed considerably longer. For example, the connecting lines to contact lands 219 and 229 have to be laid out longer than 208. As pointed out above, these metallizations are created together by the process steps of metal seeding, metal patterning, and metal plating. The connecting lines needed for applying the common electrical potential during the plating step are severed, line segments such as 213 in FIG. 2 are left over as "dangling dead ends". Since these line segments 213 can act as antennas radiating unwanted high frequency radiation during IC operation, the low pass filter of the present invention must attenuate this unwanted radiation in order to preserve fast ramp rate signal and clock lines of the IC.

Figure 3:
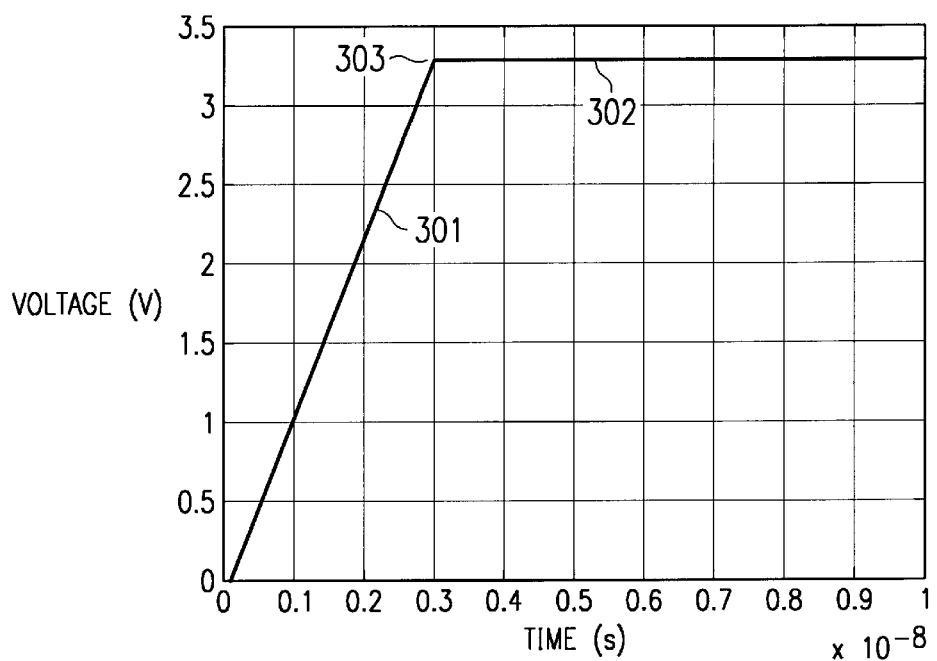
FIG. 3 illustrates the output waveform from the integrated circuit, plotted as voltage vs. time.

FIG. 3 illustrates an example of an ideal signal output from the IC, plotted as voltage ramp (in V) versus time (in s×10E-8). In signal portion 301, the signal increases linearly and uniformly; after reaching its maximum value at 303, it remains constant for the length of signal portion 302. It is common practice to obtain signal plots like FIG. 1 from calculations using a "Simulation Program with Integrated Circuit Emphasis" (SPICE) as provided by the University of California at Berkeley, USA, for use with IC designs.

Figure 4:
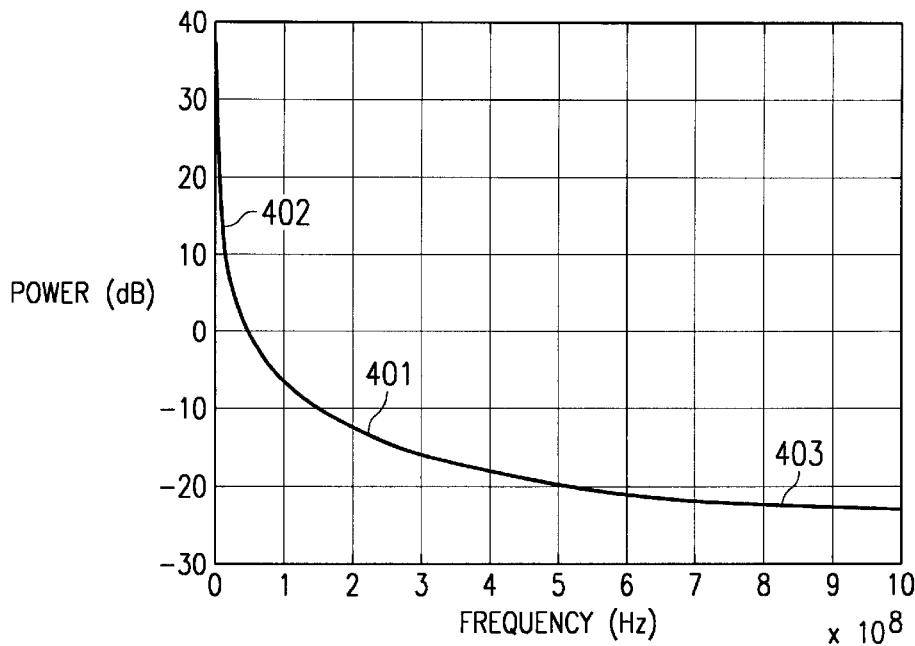
FIG. 4 illustrates the output power distribution from the integrated circuit vs. frequency.

The IC output signal of FIG. 3 can be subjected to Fourier analysis. The resultant frequency distribution can be plotted in the frequency domain as a function of its energy, or power, content. In FIG. 4, the output power distribution (expressed in dB) is plotted as a function of frequency (in Hz). Curve 401 shows a rapid fall-off with increasing frequency; most power is concentrated in the frequency regime less than 0.5×10E8 Hz (curve 402 in FIG. 4). It should be noted that the frequency regime around 9×10E8 Hz is still represented by about −23 dB (curve 403 in FIG. 2), a power generally too high for electronic operation and therefore in need of filtering.

Instead of individual calculations, it is convenient to transform plots of time-domain into plots of frequency-domain using computer programs such as MATLAB®, Simulink®, and Stateflow™, commercially available from MathWorks, Inc., 24 Prime Park Way, Natick, Mass., 01760–1500 USA.

Figure 5:
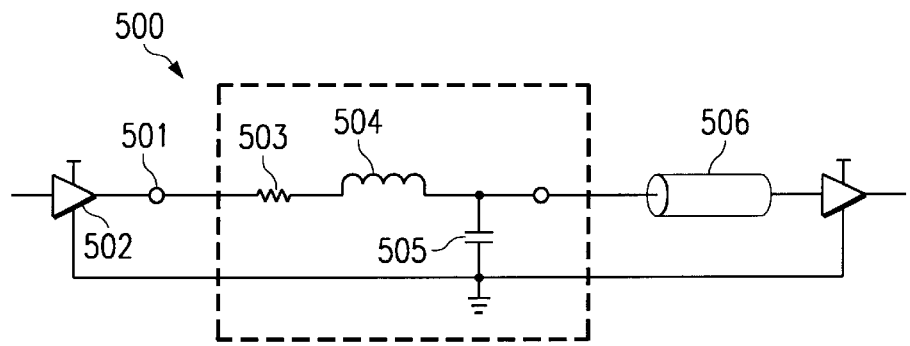
FIG. 5 is a block diagram of a low pass filter used by the invention.

FIG. 5 shows the block diagram of a low pass filter. According to the invention, the filter is created by a single metallization level, integral to the semiconductor package substrate. The filter does not require external components. Furthermore, it is confined substantially into the substrate area reserved for attaching the IC chip. The low pass filter, generally designated 500, receives the signal 501 from the driver 502 in the IC. Generally the low pass filter consists of at least one resistance 503, at least one inductance 504, at least one capacitance 505. The electrical circuit is closed by the buffer 506 (transmission line) on the assembly board.

In U.S. Patent Application Serial No. 60/116,274, filed Jan. 19, 1999, (Lamson et al., "System for Electrically Modeling an Electronic Structure, and Method of Operation"), a method is described to calculate electrical parameters from geometrical data and vise versa. The electrical parameters especially include inductance, capacitance, and resistance values. By way of example, a low pass filter for the high frequency IC attached to the substrate of FIG. 1 is to be calculated. The first step is to determine the high frequency attenuation of a low filter constructed of a set of electrical components. The next step is to construct the geometries of the electrical components within the constraints of the allotted area of the package substrate in FIG. 1. The modeling steps have to be repeated until both goals of high frequency attenuation and geometrical fit are achieved.

For the low pass filter of FIG. 5, the goal is the attenuation of high frequency components in the vicinity of 9×10E8 Hz by about 3 to 4 dB. This goal is achieved by electrical components having a resistance in the range from about 0.16 to 0.2 $\Omega$, an inductance in the range from about 10 to 30 nH, and a capacitance in the range from about 6 to 9 pF. Using these values, other frequencies are attenuated as well.

Figure 6:
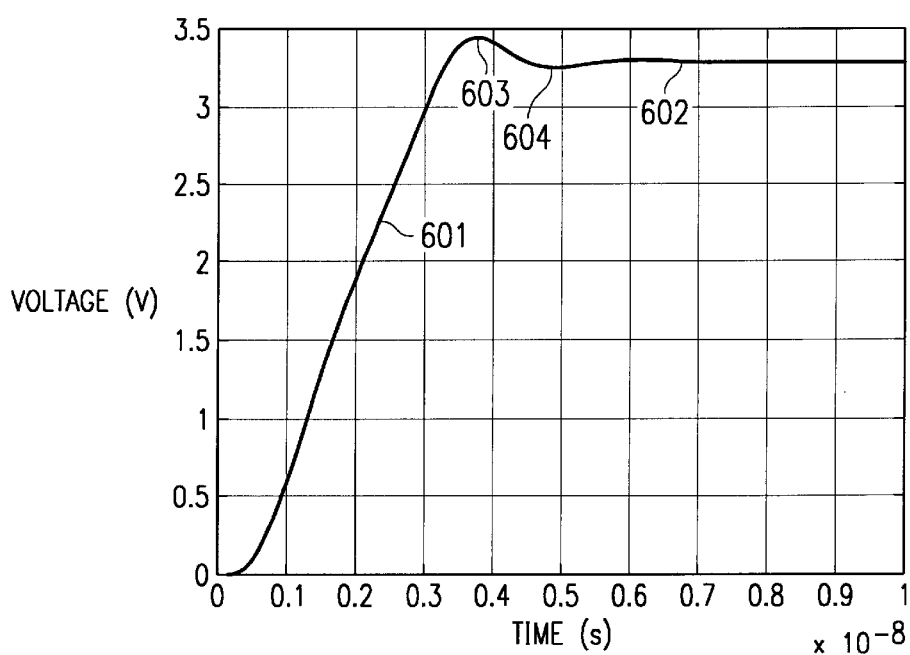
FIG. 6 illustrates the filtered output waveform on the basis of the invention, plotted as voltage vs. time.

The result of the filtering on the signal output from the IC is shown in FIG. 6. The signal ramp 601 is approximately linear. The constant portion 602 is reached with only minimal overshoot 603; the oscillations 604 are rapidly damped.

Figure 7:
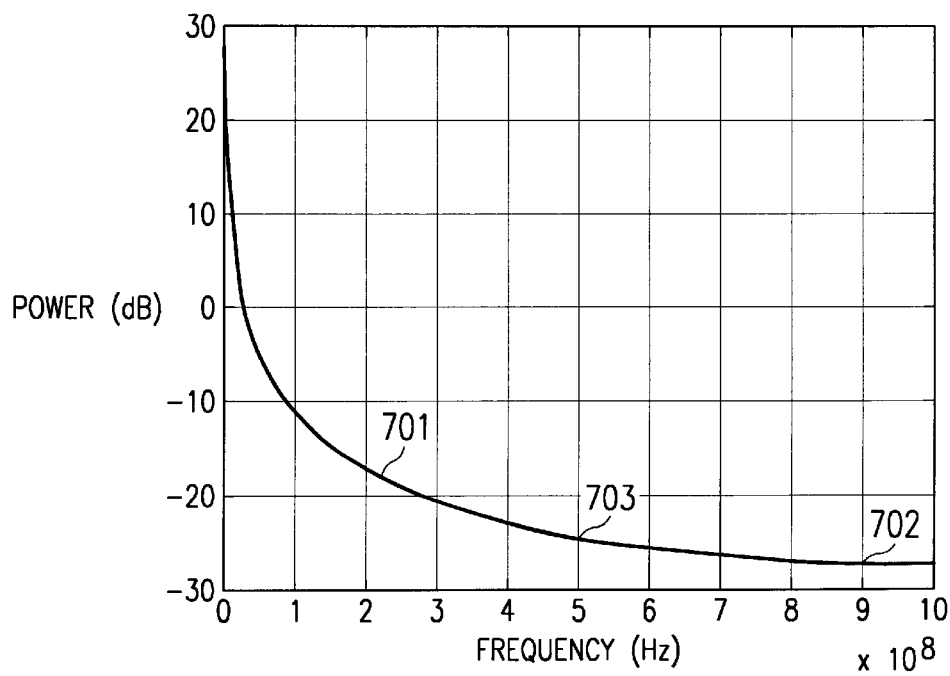
FIG. 7 illustrates the filtered output power distribution from the integrated circuit vs. frequency on the basis of the invention.

The result of the filtering on high frequency attenuation is shown in FIG. 7. The IC output power distribution 701 exhibits a significant shift towards reduced power, as a comparison with the curve 401 in FIG. 4 indicates. In the vicinity of 9×10E8 Hz (702 in FIG. 7), the high frequency components are attenuated by about 3 to 4 dB, in the vicinity of 5×20E8 Hz (703 in FIG. 7), by about 4 to 5 dB. Similar attenuations are accomplished at other frequencies. In summary, the low pass filter is effective in lowering the high frequency radiation with only minimal distortions of the signal waveforms.

Figure 8:
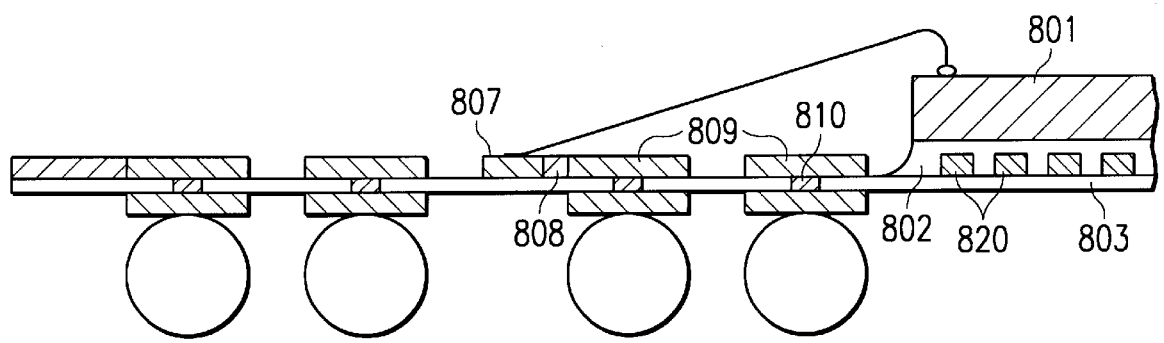
FIG. 8 is a simplified and schematic cross section of a portion of a ball grid array package substrate integral with low pass filter located in the substrate area for chip attachment according to the invention.

According to the invention, the constituents of the low pass filter are integrated into the substrate (especially the substrates of semiconductor packages) within the process scope of the standard metallization step, however without requiring additional process steps and without requiring additional substrate real estate. FIG. 8 indicates the solution according to the invention. The advantages of the invention become clear when FIG. 8 is compared with FIG. 2. FIG. 8 is a schematic and simplified cross section of a portion of an IC chip 801 mounted on substrate 803. In contrast to FIG. 2, the chip attach material 802 is only applied after the patterned metal structure 820 of the low pass filter has been created substantially within the area required for the chip attachment. The attach material is an epoxy, however not silver-filled, or sometimes a polyimide, of approximately 20 to 50 μm thickness overall.

The metal consumed by the low pass filter structures 820 is deposited and patterned in the same process steps needed for forming the remainder of metal structures 807, 808, 809 and 810 on the surface of the substrate 803. Consequently, no extra process step is required to create the low pass filter structures of the invention.

Figure 9:
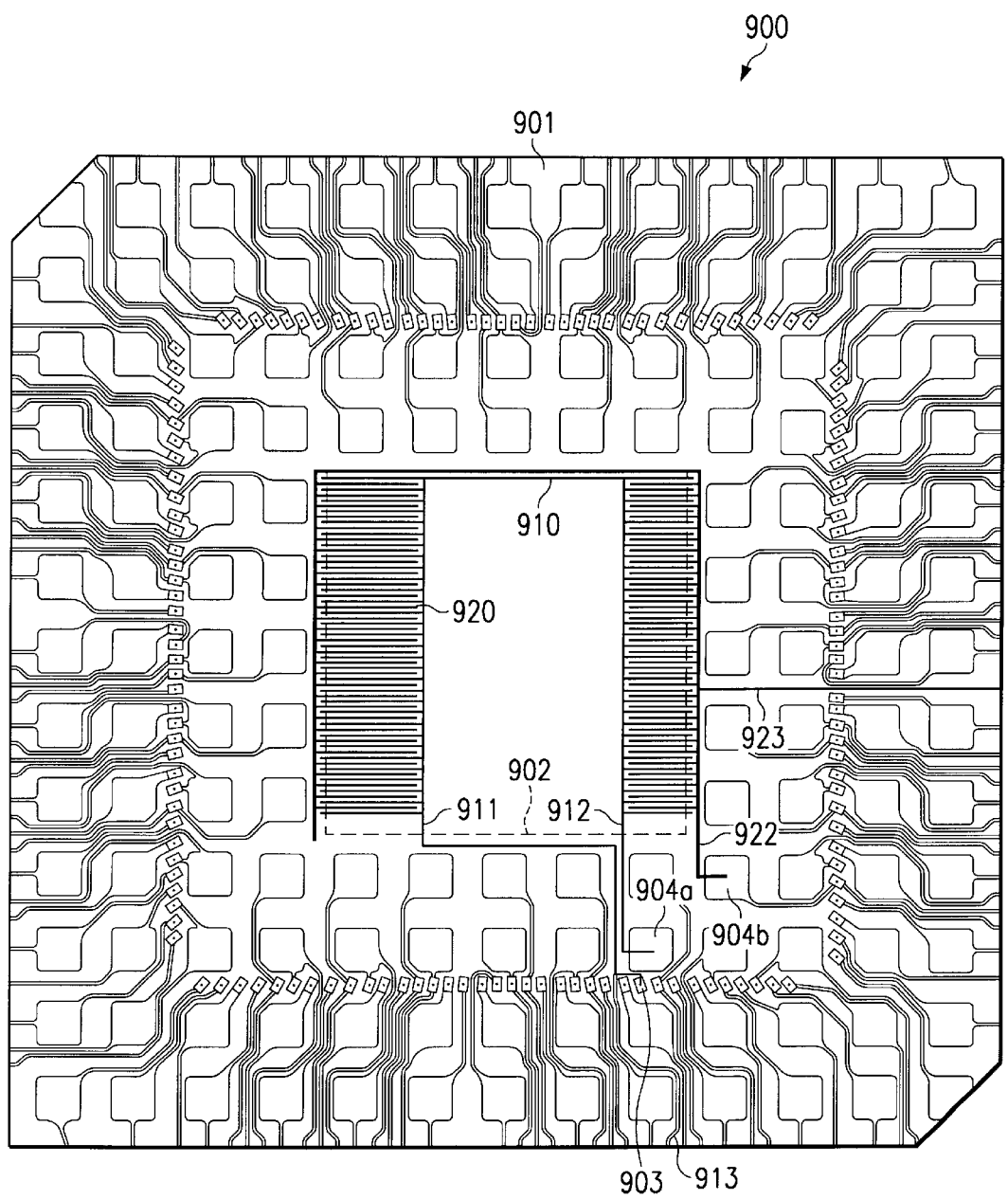
FIG. 9 shows the metal connection and low pass filter layout on the surface of a ball grid array substrate according to the invention, before the integrated circuit is attached.

The advantages of the invention become clear, when FIG. 9 is compared with FIG. 1. FIG. 9 is the top view of the substrate generally designated 900 of a ball grid array package for a semiconductor device requiring 144 ball connections (on the bottom surface of the substrate, not shown in FIG. 9). The insulating layer 901 of the substrate is made of organic material in the thickness range from about 70 to 150 μm, as mentioned in conjunction with FIG. 1.

The dotted line 902 encloses the area reserved for attaching the IC chip. Substantially within this area are accommodated one inductance 910 and one capacitor 920 of the low pass filter of the invention. The one lead 911 of the inductance 910 originates with the metallization 903, cooperatively intended for a bonding wire stitch terminal. The other lead 912 of the inductance 903 is placed on terminal pad 904a, which connects to a metal-filled via and a solder ball (not shown in FIG. 9). During the plating step of the metal deposition process, metal line 913 is connected to the applied plating potential.

The inductance lead 912 further doubles as the "inner" comb terminal of capacitor 920. The "outer" comb 922 is connected to terminal pad 904b, which connects to a metal-filled via and a solder ball at ground potential (not shown in FIG. 9). During the plating step of the metal deposition process, metal line 923 is connected to the allied plating potential.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the package may be a BGA package or any other semiconductor device package. As another example, the electrical characteristics of inductance and/or capacitance of the low pass filter can be modified in order to attenuate or filter different regimes of the frequency spectrum. As another example, the geometrical layout of capacitance and/or inductance of the low pass filter can be patterned differently, if the IC chip is attached to the substrate by a flip-solder process instead by adhesive and wire bonding. It is therefore intended that the appended claims encompass any such modifications or embodiments.

We claim:

1. A semiconductor package substrate for assembling an integrated circuit chip operable at fast ramp rate signals and clock rates, comprising:

an insulating support having a region for attaching said chip;

a pattern of electrical interconnections, disposed on said substrate in one metallization level and operable for transmitting waveforms; and a low pass filter for removing unwanted high frequency components in the frequency range up to about 10 GHz from said transmitted waveforms, comprising a network of inductors and capacitors formed within said one metallization level and positioned substantially within said substrate region for chip attachment.

2. The substrate according to claim 1 wherein said semiconductor package is a ball grid array package.

3. The substrate according to claim 1 wherein said network comprises at least one inductor and one capacitor.

4. The substrate according to claim 1 wherein said network further comprises at least one resistor.

5. A semiconductor package substrate for assembling a high frequency integrated circuit chip, comprising:

an insulating support having a region for attaching said chip;

a pattern of electrical interconnections disposed on said substrate in one metallization level, at least one them having the unwanted property of emitting high frequency radiation in the range of up to 10 GHz; and a low pass filter for attenuating said radiation, comprising a network of inductors and capacitors formed within said one metallization level and positioned substantially within said substrate region for chip attachment, whereby said substrate preserves fast ramp rate signals and clock rates of said integrated circuit.

6. The substrate according to claim 5 wherein said semiconductor package is a ball grid array package.

7. The substrate according to claim 5 whereby said network includes narrow and wide traces suitable for filtering radio frequency radiation.

8. The substrate according to claim 5 wherein said filter can be changed as needed to address differences in characteristics of said circuit or the assembly board.

* * * * *